United States Patent [19]

Geiss

[11] 4,069,618
[45] Jan. 24, 1978

[54] RADIANT RESISTANT CLOSURE ASSEMBLY

[75] Inventor: Charles Geiss, Bayport, N.Y.

[73] Assignee: All-Shield Enclosures, Inc., Westbury, N.Y.

[21] Appl. No.: 721,557

[22] Filed: Sept. 8, 1976

Related U.S. Application Data

[63] Continuation-in-part of Ser. No. 541,457, Jan. 16, 1975, abandoned.

[51] Int. Cl.² ................................................. E06B 7/22
[52] U.S. Cl. ................................. 49/483; 174/35 MS
[58] Field of Search ................. 49/483, 493, 496, 489, 49/475; 174/35 MS, 35 GC

[56] References Cited

U.S. PATENT DOCUMENTS

| | | | |
|---|---|---|---|
| 2,528,264 | 10/1950 | Coppock et al. | 49/489 |
| 2,857,633 | 10/1958 | Bunker | 49/489 X |
| 3,055,969 | 9/1962 | Schaller, Jr. | 174/35 MS |
| 3,437,735 | 4/1969 | Schaller, Jr. | 174/35 MS |
| 3,466,804 | 9/1969 | Swaneck, Jr. | 49/483 |
| 3,589,070 | 6/1971 | Hansen | 49/483 |

FOREIGN PATENT DOCUMENTS 909,009 10/1962 United Kingdom ........... 174/35 MS Primary Examiner—Philip C. Kannan
Attorney, Agent, or Firm—S. C. Yuter

[57] ABSTRACT

A radiant resistant closure assembly is described for joining a door and its frame including a resilient contact retained in position by a holding plate attached to the frame of the door. The contact extends into a slot along the edge of the frame and receives a blade-like rigid contact mounted to the door. The door is closed in a manner whereby the rigid contact blade-like member enters into the slot, is frictionally engaged by the resilient finger contact, and is held in position. For insuring further radiation resistance, an RF shielding mesh may be placed down in the bottom of the slot. The resilient contact encountered by the blade may include two offset bowed finger-like members, the second being retained on the opposite side of the slot from the first by means of a retaining clip friction fitted into the slot itself.

9 Claims, 8 Drawing Figures

U.S. Patent  Jan. 24, 1978  Sheet 1 of 3  4,069,618
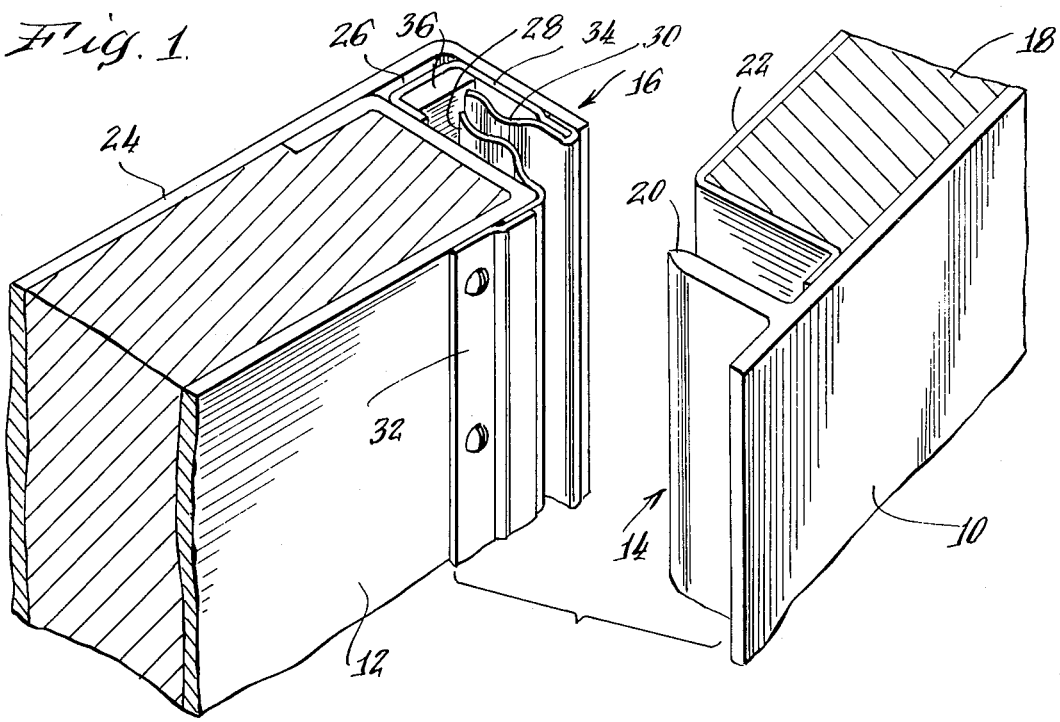
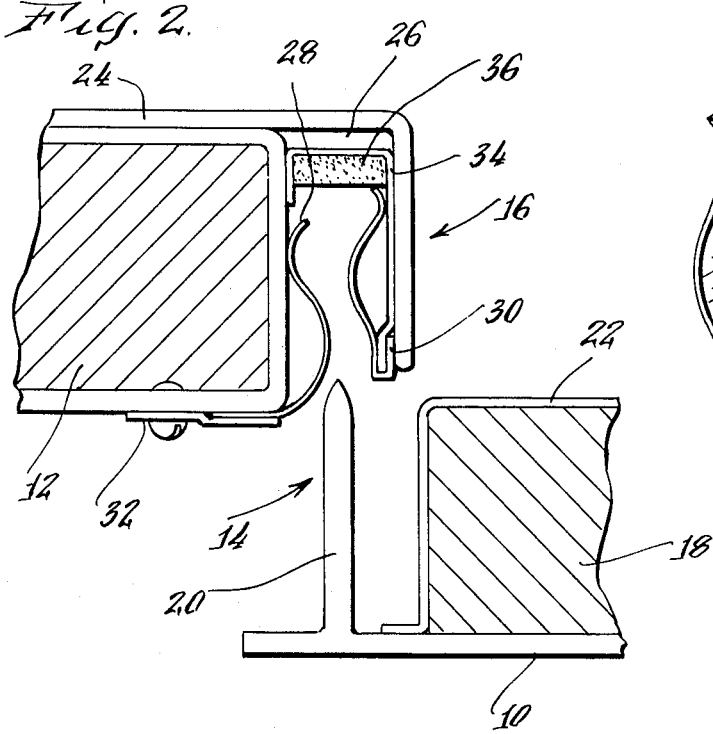
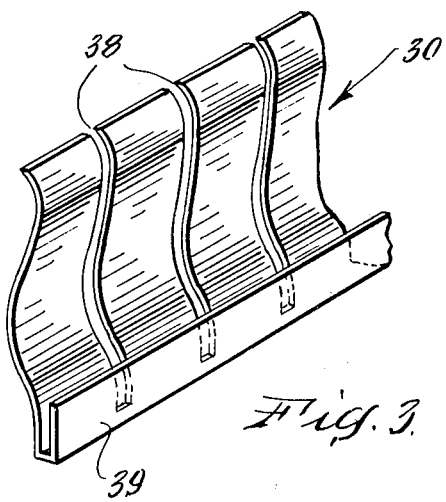
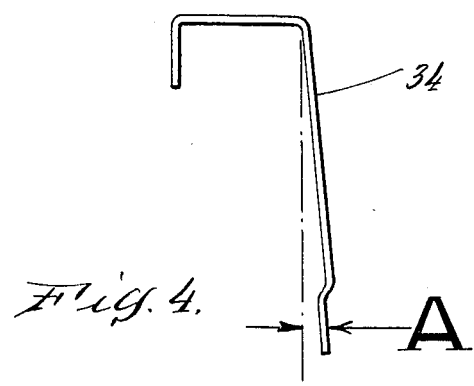

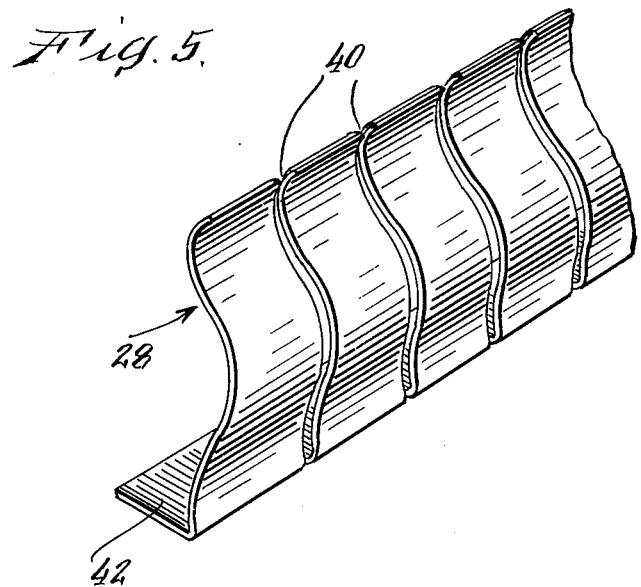
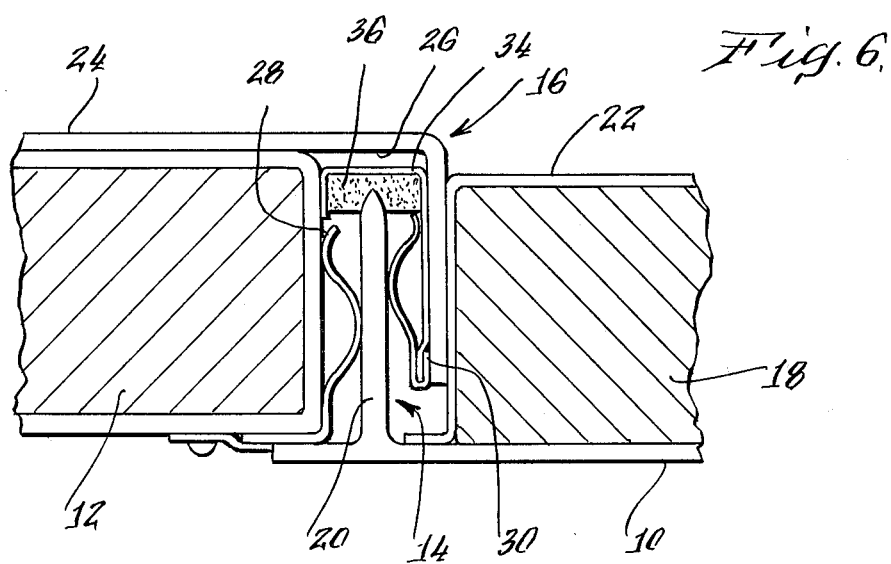

RADIANT RESISTANT CLOSURE ASSEMBLY

RELATED APPLICATION

This is a continuation-in-part application of Ser. No. 541,457, filed Jan. 16, 1975, now abandoned.

BACKGROUND OF THE INVENTION

This invention relates to door closure mechanisms and more particularly to a mechanism and construction for a door and frame whereby closure may be effected in a radiation resistant manner.

RF shield mechanisms utilized in enclosures in conventional use today experience unreliable performance due to improper use of materials, marginal design and inability of closures to withstand constant usage. The present construction techniques result in a high incidence of mechanical failure whereas the use of improper materials result in marginal electrical performance and are subjected to continuous degradation. Typical configurations have employed step joint constructions having pluralities of metal strips along the step contacts between door and frame, and sliding arrangements where each of the abutting sliding contacts include strip-like metal portions forming a closure seal between the door and frame. In the U.S. Pat. No. to C. A. Hansen, 3,589,070, issued June 29, 1971, a radiation resistant enclosure is constructed of two strips of oppositely offset resilient friction engaging elements which must be fitted into specially designed channels formed as elongated grooves along both sides of a holding slot designed to accommodate these members. These construction techniques require extensive soldering, positioning and fabricating techniques and are difficult to align, maintain and repair.

It is accordingly the object of the present invention to provide a novel and unique enclosure design resulting in a rigid lightweight construction.

It is another object of the present invention to provide material selections compatible with magnetic, electric and plane wave performance characteristics.

It is a further object of the present invention to provide a construction of minimal friction, but with maximized electrical continuity between the door and frame assembly.

SUMMARY OF THE INVENTION

The foregoing objects are accomplished in accordance with the invention by providing a radiation resistant closure assembly for joining door and a frame with first and second closure members, one of which is secured to the door and the other of which is secured to the frame. The first closure member includes a rigid elongated blade-like member which is adapted to be inserted into the other closure member, formed as a slot and including at least one bowed resilient finger-like contact protruding into the slot. The finger contact is maintained in position by means of a clamping plate formed outside the slot and attached to the second closure member. For closure, the elongated blade is inserted into the slot and forms a friction contact providing good electrical conductivity with the bowed finger contact as well as maximized holding. It is further possible to employ a second finger contact offset from the first finger contact positioned to apply pressure on the opposite wall of the slot. By offsetting the bowed portions of the first and second fingers, minimized frictional resistance to the entry blade member is realized, but a maximized electrical contact and superior holding characteristics are also achieved.

BRIEF DESCRIPTION OF THE DRAWINGS

The foregoing objects and brief description of the present invention will become more apparent from the following more detailed description and appended drawings wherein:

FIG. 1 is an isometric view of the closure mechanism of the present invention showing the relationship of the first and second closure members;

FIG. 2 is a horizontal sectional view of the two-edge portions of the door frame showing the door in partially closed position;

FIG. 3 is a detail of one set of finger contacts;

FIG. 4 is a detail of the spring retaining clip;

FIG. 5 is a detail of the other finger contact;

FIG. 6 is a further detail of the closure join in a closed position showing additional mesh sealing;

DETAILED DESCRIPTION OF THE DRAWINGS

Figure 7:
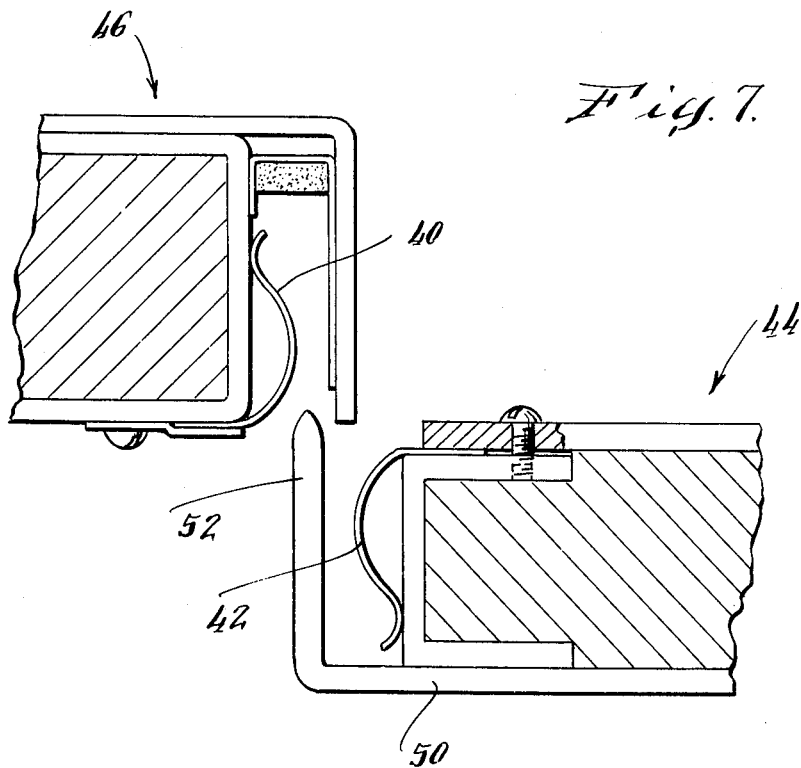
FIG. 7 is a preferred embodiment of a closure in open position.

Referring now to FIG. 1, there is shown a door 10 and a frame 12 in isometric view, each having a closure member indicated generally as 14 and 16, respectively, affixed thereto. It is understood that although it is preferred that the door 10 has the closure 14 and that frame 12 has the closure 16, the roles of the closure members may be reversed on the respective elements.

The door panel 10 is constructed as a hollow metal unit with either honey comb or framing installed inside in the area 18 inside the door so as to provide stiffness. The hinge area and latching areas (not shown) are reinforced to accommodate the hinges on the door closing system itself. The entire door panel is completely RF sealed with all seams heli-arced welded. The door material is preferably 18 gauge steel or heavier. The door panel is further provided with an internal panel frame 22 for containing the interior portion 18 which is also constructed of heavy gauge steel and attached to the main frame by welding or pop riveting. The frame 22 may also be formed as part of the door as a single structural element.

Door panel 10 includes a rigid contact element 20 formed as a blade and which is constructed so as to protrude from the door panel about the complete circumference of the door. It is, of course, also possible to utilize the blade in only sections around the door frame, however, maximum RF sealing is achieved when the blade 20 is provided around the entire perimeter of the door. The blade is constructed of plated steel and is of a thickness to provide the maximum magnetic attenuation at all frequencies. The blade is designed to resist wear and is self-cleaning when making contact with its complementary structure in the door frame 12 as will be described further hereinbelow. The choice of plated steel in the fabrication of the entire door assembly provides attenuation which cannot be achieved satisfactorily in all areas of application, particularly magnetic, by the use of bronze or brass extrusions or by aluminum or other similar material that is not completely compatible with achieving magnetic attenuation at all frequencies. By magnetic attenuation at all frequencies it is intended that achieving attenuation of 45 db at 1 kilohertz and 120 db in electric and plane wave through 10 ghz is considered a satisfactory level of attenuation.

A second closure member 16 which is formed at the edge of the door frame 12 is also illustrated in FIG. 1. As shown in FIG. 1 the frame includes members 24 formed of heavy gauge metal such as an 11 gauge plated steel and formed in such a manner so as to form a slot 26 along the edge thereof. Inside the slot 26 are positioned a plurality of electrical contacts for the purpose of making contact with the blade 20 of the door 10 upon insertion. More particularly, a first finger contact 28, including a bowed central portion, is placed around the front interior corner of the slot 26 in the manner illustrated whereby the bowed central portion extends down into the slot. A second finger contact 30 is mounted on the opposite wall of the slot 26, and also includes a central bowed portion extending into the slot 26. The central bowed portion of the finger 30 is offset or displaced in the direction of entry of the blade 20 from the central bowed portion of the finger 28. Offsetting the central bowed portions minimizes the entry resistance to the contact 20 while providing a high friction contact holding the blade 20 in position after insertion. The internal walls of the slot 26 are smooth and are formed so as to be parallel to one another.

The first finger portion 28 is held in position by means of a holding plate 32 which is bolted in position on the internal portion of the frame 12. By bolting the finger contact 28 in position, easy insertion and removal is facilitated. Similarly, the second finger 30 is held in position by insertion behind the wall of a spring-like retaining clip 34 which is in turn inserted into the slot 26 in a manner whereby frictional contact is maintained by the naturally outwardly expanding force of the retaining clip 34 and a restraint is placed thereupon by the parallel walls formed by the slot 26. The use of the retaining clip 34 permits the easy insertion and removal of the finger contact 30 and thereby permits easy repair and adjustment. FIG. 4 illustrates the manner wherein the clip is formed, with a natural displacement "A" permitting the parallel slot walls to provide a compressing force to the clip when inserted into the slot.

Referring to FIG. 2, a horizontal sectional view of the edge portion of the frame showing the relative positioning of the fingers with respect to the insertion of the blade 20 is illustrated in greater detail. For further improving the RF shielding factor of the joint, an RF mesh gasket 36 may be inserted into the well formed by the end of the retaining clip 34 for contacting blade 20 when it is fully inserted into the slot 26. The sealing factor may be further improved by inserting additional RF gasket mesh into the pocket formed between the bottom of the slot 26 and the exterior base of the retaining clip 34, as shown in greater detail in FIG. 6. The gasket mesh is a metallic wire form, as for example, a wire mesh of conductive steel, copper or an electroplate.

Referring to FIG. 3, the construction of the finger contact 30 is illustrated in greater detail. As is shown, the finger contact 30 is a single elongated piece of a light gauge beryllium copper which is provided with a plurality of slits 38 separating teeth-like sections defining each of the finger contacts, and a continuous backing portion 39. The separable slits 38 permit simple repair and maintenance to be performed on the closure. For example, if one of the finger sections of the finger contact 30 should become dented or otherwise protrude into the slot, it is possible to easily remove the entire contact 30 by sliding the backing portion 39 from beneath the retaining clip 34, cutting off the objectionable finger element and reinserting the backing portions 39 back into the slot and beneath the compressively applying force of the wall of the retaining clip 34. Thus, a simple and easily maintainable closure mechanism may be realized. No soldered joints need be cut and no extensive replacement or repair process is necessary.

The other finger contact 28 is shown in greater detail in FIG. 5. Here again, as before, the finger contacts are made of a light gauge beryllium copper having a bowed central portion and divided into a plurality of separable elements having a construction with individual teeth-like sections and slots 40 separating the individual fingers of the contact, and a continuous backing portion 40. The backing portion of the contact 42 extends at substantially right angles to the plane formed by the front portion of the finger contact 28 and adapts itself to wrap around the right angle edge of the inner portion of the frame 12 for securing by means of the clamping action of a holding plate 32. As with the other contact 30, contact 28 may be easily removed by loosening the bolt securing the holding plate 32 to the inner portion of frame 12, and sliding the backing portion 42 of the fingers 28 out from beneath the holding plate 32. Objectionable fingers may be removed by merely clipping or removing the offensive finger, re-inserting the entire contact 28 back into the slot and securing same by tightening the bolts on the holding plate 32. Thus, the finger contacts 28 and 30 are removable without tools and may be replaced without tools merely by slipping the retained back portion of the finger contact 42 between the clip and the frame or the retention strip and the frame, and a simply constructed and easily maintainable door closure seal is realized. It should be noted that the retaining clip 34 is constructed of an elongated solid piece of metal, also preferably beryllium copper and itself provides an attenuation factor contributing to the radiation sealing features of the novel closure mechanism.

Figure 8:
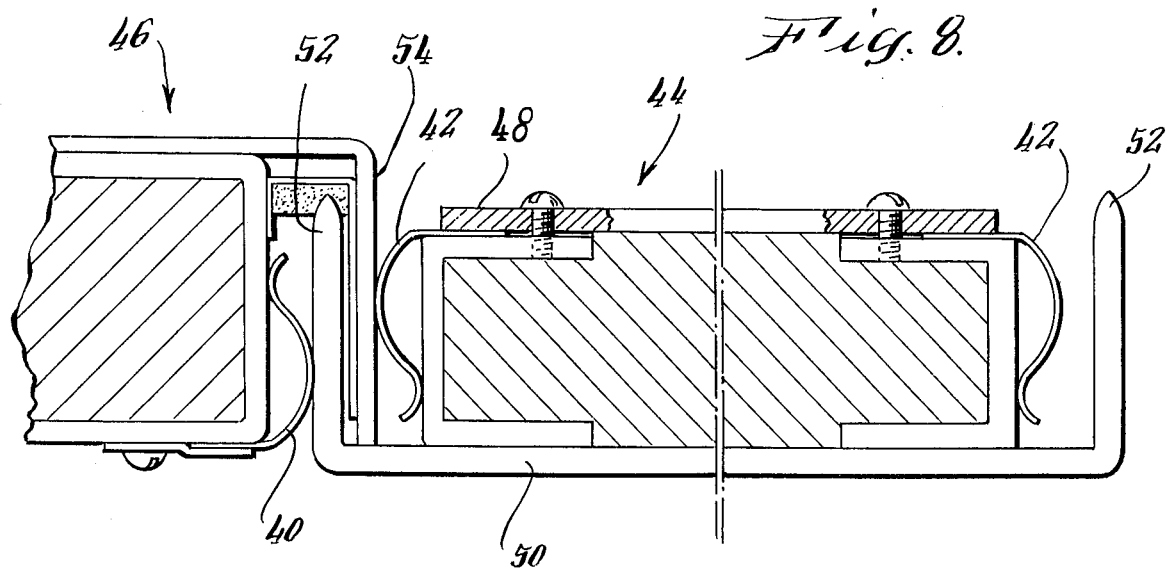
FIG. 8 shows the embodiment of FIG. 7 in a closed position.

Referring to FIGS. 7 and 8, a preferred improved embodiment is shown. In this embodiment, the opposed finger contacts 40 and 42 are positioned in door panel 44 and door frame 46, respectively. The construction shown in FIGS. 7 and 8 is otherwise the same as shown in FIGS. 1–6. In this arrangement, it has been found that the radiation shielding effect is greatly increased over the embodiments described above. Thus, the arrangement shown in FIGS. 7 and 8 provide for 52 db of attenuation at 1 kilohertz, and 38 db at 60 hertz. For this embodiment it has also beed found advantageous to provide the back panel 48 and door frame 50 of 14 gauge electric furnace high permeability steel such as Aremco type 1010, available from the Aremco Steel Company of Pennsylvania.

The construction provides for opposed finger contacts applying a displaced pressure along the blade 52, and the frame extension member 54. This arrangement retains the lower entry resistance advantage described in connection with FIGS. 1–6 while giving the added advantage of improved radiation shielding. This advantage is evident in the closed position shown in FIG. 8 due to creation of a dual shielding RF plane; the upper RF plane formed by the metallic contact through finger 42 and the lower RF plane formed by the metallic contact through the finger 40.

The same advantages as described with constructional features of the finger contacts remain in connection with FIGS. 7 and 8 as were described in connection with FIGS. 1-6.

Other features, advantages, characteristics, alternatives, modifications and variations of the present invention will be apparent to those skilled in the art, and such may be made by those skilled in the art within the spirit and scope of the present invention.

What I claim is:

1. A radiation resistant closure assembly for joining a door and its frame, comprising first and second closure members, one of said members secured to the frame of said door, the other to the frame adapted to receive said door, said first and second members each including a pair of walls spaced from each other and defining a slot, each outer wall of said pair being insertable into the slot formed by the pair of walls on the opposing closure member, said walls thereby forming a pair of slots between said door and said frame, a first finger contact positioned in a first of said pair of slots along one of said walls, a second finger contact positioned in the second of said pair of slots along another of said walls, said first and second finger contacts opposed to one another and each having a bowed portion displaced from one another along the path defined by said pair of slots, said bowed portions of each of said finger contacts being resiliently urged against an opposing wall of a respective slot to apply a pressure against said opposing wall, thereby holding said door and door frame in relatively rigid fixed relationship.

2. A radiation resistant closure assembly for joining a door and its frame, comprising first and second closure members, one of said members secured to the frame of said door, the other to the frame adapted to receive said door, said first member comprising a first finger contact, a holding means retaining said first finger contact to said first member with a portion of said first finger contact extending into a slot formed along the length of said frame by two parallel walls, said first finger contact extending into said slot along one of said walls, a second finger contact, a retaining clip coupled to said frame for holding said second finger contact along the other of said parallel walls, said first and second finger contacts opposed to one another and each having a bowed portion displaced from one another along the path defined by such slot, said second member including a rigid contact extending from said second member and insertable for closure into said slot and electrically contacting the bowed portion of both said first and second finger contacts in a manner wherein said rigid contact is maintained in position between said first and second finger contacts.

3. The closure assembly of claim 2, wherein said first and second finger contacts are each divided into a plurality of separated extending bowed finger portions and a continuous backing portion, said first finger portion held in position by said holding means clamping said backing portion thereof to said second member and said second finger held in position by said retaining clip spring compressing said backing portion of said second finger adjacent a wall of said slot.

4. The closure assembly of claim 2, wherein said slot includes a shielding mesh of a wire formed of a metallic composition.

5. The closure assembly of claim 2, wherein said frame is steel and said finger contact is beryllium copper.

6. A radiation resistant closure assembly for joining a door and a frame each respectively comprising first and second closure members, a slot formed along the length of each said closure member by two parallel frame walls, said first closure member including a first finger contact, said second closure member including a second finger contact, holding means for retaining each said finger contact in said slot adjacent a respective one of said walls, each said finger contact having a portion thereof resiliently formed and bowed in a transverse direction in said slot, said portion of one finger contact being offset from the corresponding portion of the other finger contact, one of said walls of each of said closure members being a rigid blade extending therefrom and insertable for closure into the slot formed in the other closure member and electrically contacting the facing bowed portions of said finger contacts in a manner wherein rigid contact is maintained by the resilient force applied to each said blade by said finger contacts.

7. The closure assembly of claim 6, including an elongated shielding body formed of a metallic mesh material, and wherein a clip is adapted for positioning said shielding body for contact by a segment of said rigid blade.

8. The closure assembly of claim 7, wherein said clip includes a first, second and third leg segment for forming a cup-shaped clip segment for receiving and positioning said shielding body in said frame slot.

9. A radiation resistant closure assembly for joining a door and a frame comprising first and second closure members, one of said closure members secured to said door the other to said frame, a slot formed along the length of said frame by two parallel frame walls, said first closure member comprising a finger contact, a means for retaining said finger contact in said slot adjacent one of said walls, said finger contact having a portion thereof resiliently formed and bowed in a transverse direction in said slot, said holding means comprising a generally L-shaped clip which is positioned in said frame slot, said clip having a first leg segment thereof extending generally parallel to one of said walls and a second leg segment thereof extending transversely in said frame slot, said clip formed to provide a resilient force for retaining said clip in said frame slot, said clip and said finger contact each having segments thereof formed for providing engagement therebetween for retaining said contact finger in said slot, said second closure member including a rigid contact extending therefrom and insertable for closure into said slot and electrically contacting the bowed portion of said finger contact in a manner wherein said rigid contact is maintained in position in said slot by the resilient force applied thereto by said finger contact, said frame slot includes an opening thereof for entry of said rigid body into said slot for contacting said finger contact, said clip flange is formed along an edge thereof extending parallel to said wall and adjacent said aperture, and said finger contact includes a U-shaped segment thereof positioned near said entry aperture and engaging said clip flange.

* * * * *